: US 7,037,953 B2
: May 2, 2006

(54) RADIATION CURABLE AQUEOUS COMPOSITIONS

(75) Inventors: Subhankar Chatterjee, Hampton, NJ (US); Mikhail Laksin, Scotch Plains, NJ (US); David Biro, Branchburg, NJ (US); Jean Dominique Turgis, Rutherford, NJ (US)

(73) Assignee: Sun Chemical Corporation, Parsippany, NJ (US)

( * ) Notice: Subject to any disclaimer, the term of this patent is extended or adjusted under 35 U.S.C. 154(b) by 0 days.

(21) Appl. No.: 10/331,676

(22) Filed: Dec. 27, 2002

(65) Prior Publication Data

US 2003/0134931 A1 Jul. 17, 2003

Related U.S. Application Data

(63) Continuation-in-part of application No. 09/538,548, filed on Mar. 29, 2000, now abandoned.

(51) Int. Cl.
*C08F 2/46* (2006.01)
*C08F 2/50* (2006.01)

(52) U.S. Cl. .......................... 522/84; 522/90; 522/104; 522/100; 522/108; 522/162; 522/164; 522/167; 522/173; 522/176; 522/178; 522/182; 522/181

(58) Field of Classification Search .................. 522/71, 522/75, 84, 85, 86, 96, 104, 100, 108, 164, 522/167, 173, 176, 178, 182
See application file for complete search history.

(56) References Cited

U.S. PATENT DOCUMENTS

| | | | |
|---|---|---|---|
| 4,107,013 A | 8/1978 | McGinniss et al. | 204/159.6 |
| 4,130,522 A | 12/1978 | McGinniss | 260/29.2 |
| 4,171,387 A | 10/1979 | Fogle et al. | 427/54 |
| 4,269,749 A | 5/1981 | Marriott et al. | 260/29.6 |
| 4,287,039 A | 9/1981 | Buethe et al. | 204/159.19 |
| 4,451,509 A | 5/1984 | Frank et al. | 427/54.1 |
| 4,528,307 A | 7/1985 | Fuhr et al. | 523/440 |
| 4,636,548 A | 1/1987 | Kossmann et al. | 524/524 |
| 4,719,297 A | 1/1988 | Henne et al. | 544/107 |
| 4,782,109 A | 11/1988 | DuLaney et al. | 524/501 |
| 4,861,916 A | 8/1989 | Kohler et al. | 568/337 |
| 5,096,938 A | 3/1992 | Beck et al. | 522/100 |
| 5,168,087 A | 12/1992 | Li Bassi et al. | 502/164 |
| 5,362,773 A | 11/1994 | Brindoepke et al. | 523/415 |
| 5,387,642 A | 2/1995 | Blum et al. | 524/591 |
| 5,442,090 A | 8/1995 | Beck et al. | 560/25 |
| 5,501,942 A | 3/1996 | Salvin et al. | 430/280.1 |
| 5,548,005 A | 8/1996 | Kurth et al. | 523/414 |
| 5,623,001 A | 4/1997 | Figov | 522/84 |
| 5,717,004 A | 2/1998 | Hashimoto et al. | 522/84 |
| 5,824,717 A | 10/1998 | Merrill et al. | 522/81 |
| 5,830,927 A | 11/1998 | Vanderhoff et al. | 522/81 |
| 6,011,078 A | 1/2000 | Reich et al. | 522/86 |
| 6,087,417 A | 7/2000 | Stevenson et al. | 523/414 |

| | | | |
|---|---|---|---|
| 2005/0019533 A1 | 1/2005 | Mossbrook et al. | 428/204 |

FOREIGN PATENT DOCUMENTS

| | | |
|---|---|---|
| CA | 2101876 | 2/1994 |
| CA | 2159265 | 3/1996 |
| DE | 3616434 | 11/1987 |
| DE | 252983 | 1/1988 |
| DE | 3740139 | 6/1989 |
| DE | 4114518 | 11/1992 |
| DE | 160660 | 1/1994 |
| EP | 0126341 | 11/1984 |
| EP | 0658 607 | 10/1997 |
| EP | 0799 871 | 10/1997 |
| FR | 2739838 | 4/1997 |
| GB | 1209851 | 10/1970 |
| GB | 1354436 | 2/1972 |
| JP | 52033929 | 3/1977 |
| JP | 55039239 | 3/1980 |
| JP | 1304935 | 12/1989 |
| JP | 05-155952 | 6/1993 |
| WO | WO 81/00569 | 3/1981 |
| WO | WO 9413467 | 6/1994 |
| WO | WO 9919369 | 4/1999 |
| WO | WO 0034400 | 6/2000 |

OTHER PUBLICATIONS

Schwalm, R., Haubling, L., Reich, W., Beck, E., Enenkel, P., Menzel K. Tuning the Mechanical Properties of UV Coatings Towards Hard and Flexible Systems, Progress in Organic Coatings, Colume 32, 1997, pp. 191–196.

Padget, J.C., Polymers for Water–Based Coatings—a Systematic Overview, Journal of Coatings Technology, vol. 66, No. 839, Dec. 1994, pp. 89–105.

Van Den Wiebl, H., De Ambrosi, A.; Water–Soluble Acrylic Resins in the Metal and Wood Industry, pp. 7–13.

Grumbkova, L.O., Gurova, N.B., Molseyeva, N.G., and Bogolyuboa, Z.S., Change in the State Standard for Methods of Testing the Fungus Resistance of Paintwork, Lakokrasochnyye Matrialy I Ikh Primeneniye, No. 6, pp. 64–68.

Chernyakov, E.A., Savenets, N.I., and Kachan, V.F., Zakhozhal, B.Y., and Shul'ga B.I., use of Fluorescent Lamps to Intensify the Process of Wood Finishing with Olyester Lacquers, Derevoobrabatyvyushchaya Prmshlennost, No. 7, 1979, pp. 607.

Belilos, Elliot, Regulatory Implications for UV/EB–Cured Coatings Used in Packaging Children's Products, Radtech Report, Sep./Oct. 1999, pp. 51–59.

(Continued)

Primary Examiner—Sanza L McClendon
(74) Attorney, Agent, or Firm—Sidney Persley

(57) ABSTRACT

A method for producing a solvent resistant, low-extractable, film from an actinic radiation curable homogenous aqueous composition containing a water soluble compound, having at least one alpha, beta-ethylenically unsaturated radiation polymerizable double bond, and water as essential components.

29 Claims, No Drawings

OTHER PUBLICATIONS

Hurd, Patrick, Customer Assurance Solutions for UV/EB in Food Packaging Markets, Radtech Reort, Sep./Oct. 1999, p. 47–50.

Hess, Jenn, a Technology of the Future?, Ink World, Jan. 2001, pp. 30–32.

Mercurio, Andrew and Flynn Roy, Latex–Based all–Surface Primers, Journal of Coatings Technology, vol. 51, No. 654, Jul. 1979, pp. 45–51.

Ellis, Stephen E., Measuring and Controlling Paper Package Odors, Radtech Report, Sep./Oct. 1999, pp. 55–59.

Reich, W., Enenkel, P., Lokai, M., Menzel, K., Schrof, W., Recent Investigations into Aqueous Radiation–Curable Systems.

Beck, Erich; Haussling, Lukas, Jager, Ulrich, Reich, Wolfgang, Schwalm, Reinhold; UV Curing with Water Based Materials, Polymeric Materials Science and Engineering, vol. 72, Spring 1995, a.

Starting Formulation 1.7E, Radiation–Curing Raw Materials (Laromer and Lucirin Grades), BASF Corporation Technical Literature, (1997).

Starting Formulation 5.45 b E, Radiation–Curing Raw Materials (Laromer® and Lucirin> Grades), BASF Corporation Technical Literature, (1997).

Starting Formulation 1.13 a E, Radiation–Curing Raw Materials (Laromer® and Lucirin® Grades), BASF Corporation Technical Literature, (1997).

Starting Formulation 1.13 E, Radiation–Curing Raw materials (Laromer® and Lucirin® Grades), BASF Corporation Technical Literature, (1997).

Starting Formulation 1.9 a U, Radiation–Curing Raw Materials (Laromer®and Lucirin® Grades), BASF Corporation Technical Literature, (1997).

Starting Formulation 1.8 E. Radiation–Curing Raw Materials (Laromer® and Lucirin® Grades), BASF Corporation Technical Literature, (1997).

Material Safety Data Sheet, Product No. 779631, Trade name Laromer® 8765, BASF Corporation, Parsippany, NJ, (Oct. 1990).

RADIATION CURABLE AQUEOUS COMPOSITIONS

FIELD OF THE INVENTION

This application is a continuation-in-part of U.S. Ser. No. 09/538,548 filed on Mar. 29, 2000 (abandoned), the contents of which is incorporated herein by reference in its entirety.

BACKGROUND OF THE INVENTION

1. Field of the Invention

This invention relates to radiation curable compositions and printing inks for the manufacture of packaging materials. More particularly, this invention relates to solvent resistant radiation curable aqueous compositions and aqueous printing inks.

2. Description of Related Art

Energy curable, low viscosity inks and coatings are typically composed of mixtures of acrylated oligomers and monomers. Typically monomers are used to control viscosity of ink or coating formulations for flexographic, gravure, roller and tower printing and coating applications. However, diluent monomers do not react completely during polymerization upon exposure to ultraviolet (UV) or electron beam (EB) radiation. Such unreacted monomers remain as residual components in the dried printing ink or coating films and are subject to migration by absorption as well as surface contact. This migration of residual components leads to a host of problems, particularly for printing or coating "odor" and "off-taste" sensitive packaging for packages such as containers for tobacco, perfume, etc. In addition, sometimes solvents are employed to achieve a coating of lower viscosity.

An example of a solvent based coating is described in U.S. Pat. No. 5,824,717, Merill et al., discloses peroxide and radiation (energy) curable compositions containing isobutylene copolymers having acrylate functionality, and optionally a filler. The disclosed copolymers are acrylate modified copolymers of an iso-olefin of 4 to 7 carbon atoms and para-alkylstyrene co-monomers. Merrill discloses that the percentage of extractables from the cured composition is negligible, and that the cured composition is suitable for use in the manufacture of a variety of high purity rubber goods used in the pharmaceutical and health care industries. Merrill further discloses that the compositions may be used as condenser packings, food contact material, wire cable insulation materials, and in the manufacture of high purity hoses. Merrill discloses that coatings are prepared by dissolving the copolymer in toluene.

Problems resulting from odor, off-taste and residual extractables with currently available UV/EB printing inks and coatings has kept energy curable products at bay from the high volume packaging market, which still is largely served by conventional solvent or water based flexo printing inks and coatings which require the removal of the solvent or water before curing. Acrylated oligomers typically have viscosities which are too high to be used per se (i.e., without a monomer diluent) for making low viscosity coatings and especially printing inks.

The use of water as a diluent for mixtures of UV/EB curable acrylated oligomers is disclosed in U.S. Pat. No. 6,011,078 for wood and floor coating applications. The formulations are dispersions or emulsions, which require prior evaporation or imbition of water on non-absorbent substrates before exposure to light.

Thus, the present state of producing low extractable packaging materials, which are not as low as to be FDA compliant for direct food containers, requires the use of solvents and/or dispersions using a multi-step procedure wherein evaporation or water or non-absorbent substrates is necessary.

There continues to be a need for homogeneous, monomer and solvent free, UV/EB curable aqueous formulations which provide high solvent resistance and have insignificant odor and/or low levels of extractable components.

SUMMARY OF THE INVENTION

The invention is a method for producing a low-extractable non-FDA compliant film suitable for use in pharma and food packaging applications (i.e. printing ink film or coating) comprising the steps of:

a) providing an actinic radiation curable homogeneous aqueous composition consisting essentially of a water-soluble compound which contains at least one alpha, beta-ethylenically unsaturated radiation polymerizable double bond and water;

b) applying said homogeneous aqueous composition onto a surface; and c) irradiating the surface with actinic radiation in the presence of the water.

A further embodiment of this invention is an actinic radiation curable homogeneous aqueous composition consisting essentially of a water soluble compound which contains at least one alpha, beta-ethylenically unsaturated radiation polymerizable double bond and water.

DETAILED DESCRIPTION OF THE INVENTION

The present invention relates to a novel homogeneous aqueous radiation curable composition which consists essentially of a water soluble compound which contains at least one alpha, beta-ethylenically unsaturated radiation polymerizable double bond, water and optionally a photo-initiating system. Preferably the water-soluble compound is a water soluble oligomer containing two or more acrylic groups. As used herein the term "low-extractable non FDA compliant film" is intended to mean a cured film which has a low amount of solvent extractable oligomer or residual components and therefore is not FDA compliant but is suitable for use in pharma and food packaging applications (i.e., greater than 50 ppb when subjected to solvent under a solvent extraction protocol hereinafter described). The curable composition of this invention may also contain a colorant such as a dye or pigment. Such a colored composition may be used as a printing ink or simply to form cured colored coatings. As used herein, the term "printing ink" has its conventional meaning, i.e., a colored liquid composed of a colorant, typically a solid pigment, dispersed in liquid vehicle. In particular the radiation curable printing ink of this invention comprises a pigment and a liquid vehicle. Although the curable composition may be used in a number of applications which require limited extractables, the composition is particularly useful in the packaging industry, and more specifically in the packaging industry wherein cured coatings and/or printed matter come in contact with products having strict purity or contamination requirements at ambient and/or processing conditions. Cured films of this invention have insignificant or no odor, and impart no substantially contaminated products when used in packaging foods, drinks, cosmetics, pharmaceuticals, etc.

Homogeneous Aqueous Curable Composition

The homogeneous aqueous radiation curable composition of this invention contains as the essential ingredients, a water soluble compound which contains at least one alpha, beta-ethylenically unsaturated radiation polymerizable double bond, preferably the water soluble compound is a water soluble oligomer containing two or more acrylic groups; water; and optionally a photoinitiating system activatable UV radiation; and/or a colorant.

Water Soluble Compound

As used herein the term "water soluble compound" means a radiation curable compound which contains a limited number of water solubilizing groups, such as carboxyl, hydroxyl, ether and the like, sufficient to provide homogeneous solutions of the compound in water at ambient temperatures; and in addition which contains at least one alpha, beta-ethylenically unsaturated radiation polymerizable double bond. Preferably the water soluble compound is an oligomer. As used herein the term "oligomer" is intended to include compounds which contain two or more terminal, or pendent, alpha, beta-ethylenically unsaturated groups which are linked through a polymeric backbone, or through similar linking groups to a central aliphatic or aromatic backbone. Such a water soluble compound may be an epoxy acrylate, an epoxy methacrylate, a polyether acrylate, a polyether methacrylate, a polyester acrylate, a polyester methacrylate, a polyurethane acrylate, a polyurethane methacrylate, a melamine acrylate, or a melamine methacrylate. Typically the acrylate is an aromatic or aliphatic acrylate, and preferably the compound is a diacrylate ester of an alkanolglycidyl ether such as 1,4-butanedioldiglycidyl ether, an ethoxylated aromatic epoxide, and ethoxylated trimethylolpropanetriacrylate, ethoxylated trimethylolpropanetrimethacrylate, ethoxylated aliphatic or aromatic epoxy acrylate, ethoxylated aliphatic or aromatic epoxy methacrylate, polyoxy ethylene glycol diacrylate; polyoxy ethylene glycol dimethacrylate. Preferably, the ethoxylated aromatic epoxide contains 6 to 20 ethoxy groups.

Suitable compounds are aliphatic and aromatic epoxy acrylates and epoxy methacrylates, aliphatic compounds preferably being employed. These include, for example, the reaction products of acrylic acid or methacrylic acid with aliphatic glycidyl ethers.

Further suitable compounds are polyether acrylates and methacrylates, polyester acrylates and methacrylates and polyurethane acrylates and methacrylates. Among these, preference is given to the reaction products of acrylic or methacrylic acid with the polyesterols and polyetherols which were described as polycondensates. Particular preference is given to the radiation curable acrylates described in EP-A-126 341 and EP-A-279 303. Polyetherols employed in this context are preferably alkoxylated, especially ethoxylated and/or propoxylated, mono-, di-, tri- or polyfunctional alcohols.

Other suitable compounds are melamine acrylates and methacrylates. These are obtained, for example, by esterifying the free methylol groups of the resins with acrylic acid or methacrylic acid, or by transetherification of etherified melamine compounds with hydroxyalkyl methacrylates, for example hydroxyethyl, hydroxypropyl and hydroxybutyl methacrylate, hydroxybutyl acrylate.

Still further suitable compounds are, in general, thickeners which contain unsaturated groups. These include on the one hand polyurethane thickeners, which contain alpha, beta-ethylenically unsaturated double bonds as a result of the incorporation of the above mentioned hydroxyalkyl methacrylates, hydroxyalkyl acrylates. They also include polyacrylate thickeners, which are obtained by polymer-analogous reaction of, for example, hydroxyl-containing polymers, or polymers containing acid groups, with epoxide-containing methacrylates, acrylates for example glycidyl methacrylate, glycidyl acrylate or of hydroxyl-containing polymers by esterification with methacrylic acid, acrylic acid or reaction with methacrylic anhydride, acrylic anhydride or by reaction with NCO-terminated methacrylates, acrylates for example methacryloyl isocyanate, isocyanatoethyl methacrylate, isocyanatoethyl acrylate etc. They additionally include polyvinyl alcohols which are modified, for example, by reaction with methacrylic anhydride, acrylic anhydride or by esterification with methacrylic acid, acrylic acid with groups containing double bonds. Finally, they include copolymers comprising maleic anhydride as comonomer, the polymer being modified by ring opening of the anhydride with the above mentioned hydroxyalkyl methacrylates, hydroxyalkyl acrylates or with hydroxy vinyl ethers, for example butanediol monovinyl ether, cyclohexanedimethanol monovinyl ether etc., with double bonds.

Particularly preferred water soluble compounds include diacrylate esters of an alkanolglycidyl ether; wherein the alkanol has 2 or 3 hydroxy groups, such as a diacrylate of 1,4-butanedioldiglycidyl ether; a triacrylate of trimethylolpropane-diglycidyl ether, or a mixture thereof; and ethoxylated acrylic oligomers, such as an ethoxylated trimethylolpropanetriacrylate; an ethoxylated trimethylolpropane diacrylate; or a mixture thereof; wherein the ethoxylated oligomer contains 9–12 ethoxy groups. A particularly preferred water soluble compound is the diacrylate ester of 1,4-butanedioldiglycidyl ether, which is available from BASF Corporation, Charlotte N.C., as Laromer LR 8765 aliphatic epoxy acrylate.

The homogeneous aqueous, radiation curable coating compositions of this invention contain from about 0.1 to about 95% by weight of the water soluble radiation curable compound, preferably from 75 to 95 wt. % made of at least one alpha, beta-ethylenically unsaturated, radiation-curable double bond. Preferably, the curable composition contains between about 5 wt. % and about 50 wt. % water. Typically the water soluble compound is added to the coating composition in an amount sufficient to attain a solids content ranging from 75 to 95 wt. %.

Photoinitiating System

Unless the homogeneous aqueous radiation curable composition is formulated specifically for use with electron beam curing, the radiation curable coatings of this invention optionally may contain an addition polymerization photoinitiator which generates free radicals upon irradiation with UV at a wavelength ranging from 200 to 420 nanometers. Thus, the homogeneous aqueous radiation curable coating compositions of this invention optionally contains from 0 to about 10 wt. % of a photoinitiating system. Such a photoinitiating system has one or more compounds that directly furnish free radicals when activated by UV radiation. The photoinitiator system may also contain a sensitizer that extends spectral response into the near ultraviolet, visible and/or near infrared spectral regions. When cured by UV radiation, the coating compositions typically have from about 0.05 to about 20 wt. %, preferably from 0.05 to 10 wt. % and, in particular, from 0.1 to 5 wt. % of a photoinitiating system. A wide variety of photoinitiating systems may be used provided that the components of the system or their residue after polymerization, are non-migratory or substantially leachable from the cured film. Useful photoinitiators of this type are described by B. M. Monroe and G. C. Weed in an article entitled "Photoinitiators for Free-Radical-Initiated Photoimaging Systems", Chem. Rev. 1993, 93, 435–448. Photoinitiators which may be used alone or in combination, include benzophenone, 4-4'bisdiethylaminobenzophenone, 4-diethylamino, 4'-dimethylamino benzopheone, alkylbenzophenones, such as 4-methylbenzophenone, halomethylated benzophenones, Michler's ketone (4,4'-bisdimethylamino-benzophenone), halogenated benzophenones, such as 4-chlorobenzophenone, 4,4'-dichloro-benzophenone, anthraquinone, anthrone (9,10-dihydro-9-anthracenone), benzoin, isobutyl benzoin ether, benzil and benzil derivatives, such as benzil dimethyl ketal, and phosphine oxides or phosphine sulfides, such as bisacylphosphine oxides, 2,4,6-trimethylbenzoyldiphenyl-phosphine oxide, etc. Preferred photoinitiators which may be used alone or in combination with others are 4-(2-hydroxyethoxy)-phenyl-(2-hydroxy-2-methylpropyl)-ketone; isopropyl-thioxanthone; and the like.

If desired the photoinitiating system may additionally comprise a synergist, preferably a tertiary amine. Examples of suitable synergists are triethylamine, dimethylethanolamine, methyldiethanolamine, triethanolamine, amino acrylates, for example amine-modified polyether acrylates, such as the BASF Laromer® grades LR 8956, LR 8889, LR 8869, LR 8894, PO 83F and PO 84F, and mixtures thereof. In the case of pure tertiary amines they are generally employed in an amount of up to 5% by weight, in the case of amino acrylates in an equivalent amount corresponding to the number of amino groups present, based on the overall amount of the coating compositions.

Colorant

The homogeneous aqueous radiation curable composition of this invention may additionally contain from 0 to about 50 wt. % of a colorant such as a dye or pigment. Preferably, such dyes or pigments, while soluble or dispersible in the curable composition, form permanent non-migratory components in the coated cured composition. When used as a radiation curable ink, the aqueous coating solution typically contains one or more solid pigments dispersed therein. The pigment may be any conventional organic or inorganic pigment such as Zinc Sulfide, Pigment White 6, Pigment Yellow 1, Pigment Yellow 3, Pigment Yellow 12, Pigment Yellow 13, Pigment Yellow 14, Pigment Yellow 17, Pigment Yellow 63, Pigment Yellow 65, Pigment Yellow 73, Pigment Yellow 74, Pigment Yellow 75, Pigment Yellow 83, Pigment Yellow 97, Pigment Yellow 98, Pigment Yellow 106, Pigment Yellow 114, Pigment Yellow 121, Pigment Yellow 126, Pigment Yellow 127, Pigment Yellow 136, Pigment Yellow 174, Pigment Yellow 176, Pigment Yellow 188, Pigment Orange 5, Pigment Orange 13, Pigment Orange 16, Pigment Orange 34, Pigment Red 2, Pigment Red 9, Pigment Red 14, Pigment Red 17, Pigment Red 22, Pigment Red 23, Pigment Red 37, Pigment Red 38, Pigment Red 41, Pigment Red 42, Pigment Red 57, Pigment Red 112, Pigment Red 122, Pigment Red 170, Pigment Red 210, Pigment Red 238, Pigment Blue 15, Pigment Blue 15:1, Pigment Blue 15:2, Pigment Blue 15:3, Pigment Blue 15:4, Pigment Green 7, Pigment Green 36, Pigment Violet 19, Pigment Violet 23, Pigment Black 7 and the like. Pigment compositions which are also useful in the energy curable inks of this invention are described in U.S. Pat. Nos. 4,946,508; 4,946,509; 5,024,894; and 5,062,894 each of which is incorporated herein by reference. Such pigment compositions are a blend of the pigment along with a poly(alkylene oxide) grafted pigment. Aqueous curable compositions containing a colorant are particularly useful in formulating radiation curable printing inks for use in conventional printing such as flexographic, gravure letterpress, dry-offset and lithographic printing. Although each of these printing operations require inks with specific characteristics such as specific viscosity ranges, such characteristics can be realized by adjusting the ratio of solids, including the pigment and water soluble compound, and water.

Other Adjuvants

The homogenous aqueous curable compositions may contain additional adjuvants provided that the additional adjuvants do not materially affect the essential nature of the composition and that the adjuvants or their residue after polymerization, are non-migratory and are substantially not leachable from the cured film. Thus the radiation curable compositions and inks of this invention may contain the typical adjuvants to adjust flow, surface tension and gloss of the cured coating or printed ink. Such adjuvants contained in inks or coatings typically are a surface active agent, a wax, fillers, matting agents, or a combination thereof. These adjuvants may function as leveling agents, wetting agents, dispersants, defrothers or deareators, or additional adjuvants may be added to provide a specific function. Preferred adjuvants include fluorocarbon surfactants such as FC-430, a product of the 3M company; silicones, such as DC57, a product of Dow Chemical Corporation; polyethylene wax; polyamide wax; paraffin wax; polytetrafluoro ethylene wax; and the like.

The homogeneous aqueous coating compositions may contain from about 0 to about 50 wt. %, preferably from about 1 to 50 wt. % of a filler. Examples of suitable fillers are silicates obtainable by hydrolyzing silicon tetrachloride (Aerosil® from Degussa), siliceous earth, talc, aluminum silicates, sodium aluminum silicates, magnesium silicates, etc. The homogeneous aqueous coating compositions may also include from 0 to 20 wt. % of protective colloids or co-resins and/or emulsifiers. Suitable emulsifiers are those commonly employed as dispersants in the context of aqueous emulsion polymerization and known to the skilled worker, such as those described in *Houben-Weyl, Methoden der Organischen Chemie*, Volume XIV/1, Makromoleculare Stoffe, Georg-Thieme-verlag, Stuttgart, 1961, pp. 411–420. Suitable protective materials include polyvinylalcohol, polyvinypyrrolidone, cellulose, cellulose derivatives, starch, starch derivatives, gelatin, gelatin derivatives, etc.

Preparation of Low-Extractable Non FDA Compliant Cured Film

An embodiment of this invention is a method of forming a low-extractablenon FDA compliant film. In this method, the homogeneous aqueous composition previously described is applied onto a surface of a substrate and without any substantial removal of water, the applied homogeneous aqueous composition is irradiated with high energy electrons or ultraviolet (UV) radiation in the presence of the water to form a cured film. The homogeneous aqueous composition may be applied to the substrate surface as a uniform coating using any conventional coating technique. Thus the composition may be spin coated, bar coated, roller coated, curtain coated or may be applied by brushing, spraying, etc. Alternatively the homogeneous aqueous composition may be applied imagewise to the substrate surface, for instance as a printing ink, using any conventional printing technique. Once the homogeneous aqueous coating composition is applied to the substrate surface, it is immediately cured in one step without any prior removal of the water, using either high energy electrons or UV radiation. Typically the high energy electrons have an energy between about 50 and about 200 kV electrons and preferably between 85 and 180 kV electrons and are typically produced by a high energy electron device. The dosage of high energy electron ranges from about 2 to about 4 megarads (Mrads); and preferably 2.7 to 3.5 Mrads. UV irradiation may be carried out using any conventional off-contact exposure device which emits within the spectral region from about 200 nanometers to about 420 nanometers. The water in the coated composition, even on non-absorbent surfaces, does not interfere with curing process, but rather promotes complete curing of the water soluble compound into a completely cured film or image with little or no extractable residual compound. Water is believed to be removed concurrently with the curing process and/or subsequently during manipulation of the substrate. As used herein the term "cured film" is intended to include a continuous cured film composition as well as a discontinuous cured ink image composition. In either sense of the term, the cured film is adhered to a substrate and has an outer "cured surface" which defines the surface area used in the extraction procedures fully described hereinbelow.

Substrate

The substrate and its surface may be composed of any typical substrate material such as plastics, for example, polystyrene, polyvinylchloride, polynaphthelene terephthalate, polyacrylate, polyacrylic, metals, composites, glass, paper, etc. The cured coating on the substrate may be used in a variety of applications where low or no contamination from the substrate is required.

Crosslinked Film

Homogeneous aqueous radiation curable compositions of this invention have the unique characteristic in that a coating of the composition on a surface, when cured with high energy electrons or UV radiation in the presence of the water, forms a highly crosslinked cured film which is resistant to conventional solvent rub tests; and from which greater than 50 ppb of the water soluble compound or residual components are extracted by aggressive solvents such as methylene chloride, acetonitrile, etc.

Solvent Rub Test

A sample of the cured film is placed on a flat, hard surface with the cured film side up. The cured film surface is then repeatedly rubbed to and from with an applicator pad saturated with a solvent such as methylethylketone, isopropyl alcohol, or the like. The applicator pad typically is a wad of cotton, a soft fabric or a paper product; and is applied under normal hand pressure in a to-and-fro rubbing motion. The number of times the film surface can be rubbed before deterioration of the film surface (e.g., through dissolution, softening, abrasion, or the like) is a measure of the solvent resistance of the cured film. Typically, a cured film is considered solvent resistant if the film can be rubbed 10 or more times with the selected solvent, before any deterioration is observed and preferably 20 to 75 or more times.

Organolepsis

When choosing which actual product to purchase at the point of sale, major factors related to perception through the five major physical senses of sight, hearing, touch, taste and smell may have an influence. These are called organoleptic effects, and the totality is organolepsis. In packaging they are confined mainly to the sense of smell and taste.

Plastics films for packaging food, for example, are not usually required to contribute to the taste or smell of the food. On the contrary, it is usually required that they should not do so. If the taste or smell properties of the food are changed in any way, the result is almost invariably considered unfavorable. If the change is sufficiently unpleasant the result is called "off odor", "off flavor" or "tainting". These have a similar mechanistic rationale to toxic hazard, in that they arise from interactions between the food and plastic or the environment. With rare exceptions, most high molecular weight polymers are tasteless and odorless; thus the majority component of all commercial plastics films will not give rise to an off flavor or off odor. This is a remarkable generalization that can not be made for all packaging materials. Volatiles liable to diffuse from the plastic to the contents of the package are divided into those residual from the manufacturing process (hence also including residual reactants); degradation products formed during the conversion process; and additives. As for degradation products formed during the conversion process, these typically arise from polymerization. Some plastics decompose slightly on heating. In a few cases, such as polystyrene and nylon, the main reaction is depolymerization and the by product is monomer or oligomer. In the majority of cases the products are not those which would be obvious.

No mechanical equipment yet exists which can be reliably used for odor or taste testing. Also, although animals can occasionally be used for special cases, they are not suitable for testing of plastics. Consequently, human groups must be used and the human panel members must give an indication of the nature of the off odor or off taste. Although not prima facie essential, it is desirable in selecting individuals for a panel that their sensory reactions are checked against an identified specific stimuli.

Extractable Components

The level of extractables was determined using two methods: organoleptic odor test and analytical instrumental methods. It is generally accepted that the residual odor of a cured film can be correlated to residual unreacted material in a coating which migrates in the coating and typically is leachable. This unreacted material also can be extracted and quantified by analytical techniques. Odor is a subjective measurement, but is very important for consumer products where odors are objectionable or are indicative to physiological responses such as allergic reactions, dermatitis, etc.

Residual Odor Test

A coating composition is applied over paper board and aluminum foil with #3 Meyer bar then cured, depending on the composition, with UV light (UV curable compositions) delivering from 120–500 mJ/cm2 of UV energy or cured under electron beam conditions of 3 Mrad with 165 kV electrons. Coated and cured paper board and foil samples of equal dimensions are cut up and placed inside of a 1 liter glass jar with a tight "screw on" lid. The jars with samples are placed in oven at 60° C. for 30 min. After this, several people (at least 5) open each jar and rate odor on a 1 to 5 scale where "1" is the lowest odor and "5" is the strongest odor. The average score for each sample is then reported as set forth in Table A in the Comparison below. Residual odor can be related to amount of unreacted material or extractables.

Direct Solvent Extraction

One hundred square centimeters of each cured film is cut into small squares and placed into a 16 ml vial. Ten milliliters of solvent, acetonitrile or methylene chloride, is added and the sample allowed to stand for 24 hours at room temperature. After 24 hours, 3 ml of the solution is removed, filtered through a 0.2 μm polytetrafluoroethylene filter disk, and placed into an auto-sampler vial for analysis. The extracts are then analyzed using high pressure liquid chromatography (HPLC). The mobile phase is 50% water/50% methanol, pumped isocratically at 0.8 ml/min at ambient temperature. The eluent is analyzed using a photodiode array detector (PDA) monitoring at 205 nm. The column is a Phenomenex® LUNA $C_{18}$ column, 4.6 mm×250 mm 5 μ particle size with a high pressure limit of 3400 psi. The resulting residual level of extractables is then determined based on parts per billion.

The homogenous aqueous radiation curable composition of this invention will now be illustrated by the following examples but is not intended to be limited thereby.

EXAMPLE 1

Aliphatic epoxy acrylate (60 parts, Laromer LR8765 from BASF), water (14 parts), a propoxylated pentaerithytol tetraacrylate (25 parts, PPTTA, Actilane 440 from Ackros Chemicals) and an acrylated silicone (1.0 part, Rad 2200 from Tego) were mixed together to produce a stable coating. This composition was applied by wound wire rod to a thickness of 3–6 microns and cured by EB radiation at 3 megarads (Mrads) and 100 kV electrons. The resulting coating had a gloss >80 and was completely cured as indicated by a solvent rub test described supra, which results provided more than 50 methyl ethyl ketone (MEK) double rubs.

The printed surface was then exposed to a direct extraction in acetonitrile which yielded a residual level of PPTTA extractables of 760 ppb.

EXAMPLE 2

Aliphatic epoxy acrylate (60 parts, Laromer LR8765 from BASF), water (14 parts), a trimethylolpropane triacrylate (25 parts, TMPTA from Cognis Corp.) and an acrylated silicone (1.0 part, Rad 2200 from Tego) were mixed together to produce a stable coating. This composition was applied by wound wire rod to a thickness of 3–6 microns and cured by EB radiation at 3 megarads (Mrads) and 100 kV electrons. The resulting coating had a gloss >85 and was completely cured as indicated by a solvent rub test described supra, which results provided more than 70 methyl ethyl ketone (MEK) double rubs.

The printed surface was then exposed to a direct extraction in acetonitrile which yielded a residual level of TMPTA extractables of 1650 ppb.

EXAMPLE 3

Aliphatic epoxy acrylate (60 parts, Laromer LR8765 from BASF), water (14 parts), a propoxylated neo-pentylglycol diacrylate (25 parts, PO-NPGDA, Photomer 4127 from Cognis Corp) and an acrylated silicone (1.0 part, Rad 2200 from Tego) were mixed together to produce a stable coating. This composition was applied by wound wire rod to a thickness of 3–6 microns and cured by EB radiation at 3 megarads (Mrads) and 100 kV electrons. The resulting coating had a gloss >70 and was completely cured as indicated by a solvent rub test described suprawhich results provided, more than 20 methyl ethyl ketone (MEK) double rubs.

The printed surface was then exposed to a direct extraction in acetonitrile, which yielded a residual level of PO-NPGDA extractables of 24200 ppb.

EXAMPLE 4

Water (14 parts ), an ethoxylated trimethylolpropane triacrylate (85 parts, EO-TMPTA, Photomer 4149 from Cognis Corp) and an acrylated silicone (1.0 part, Rad 2200 from Tego) were mixed together to produce a stable coating. This composition was applied by wound wire rod to a thickness of 3–6 microns and cured by EB radiation at 3 megarads (Mrads) and 100 kV electrons. The resulting coating had a gloss >70 and was completely cured as indicated by the solvent rub test described supra, which results provided more than 20 methyl ethyl ketone (MEK) double rubs.

The printed surface was then exposed to a direct extraction in acetonitrile, which yielded a residual level of EO-TMPTA extractables of 996 ppb.

COMPARISON OF EXAMPLES

Examples 1 through 4 were tested via the Odor Test and the results are set forth in Table A below:

| Composition (silicone omitted) | Film | Average Odor Score |
| --- | --- | --- |
| LR8765/water/PPTTA | 1 | 2.8 |
| LR8765/water/TMPTA | 2 | 3.8 |
| LR8765/water/Po-NPGDA | 3 | 4.2 |
| EOTMPTA/water | 4 | 3.2 |

Examples 1 through 4 were tested for residual levels of extractables and the results are set forth in Table B below.

| Composition (silicone omitted) | Example | Solution Concentration |
| --- | --- | --- |
| LR8765/water/PPTTA | 1 | 760 ppb of PPTTA |
| LR8765/water/TMPTA | 2 | 1650 ppb of TMPTA |
| LR8765/water/PO-NPGDA | 3 | 24200 ppb of PO-NPGDA |
| EOTMPTA/water | 4 | 996 ppb of EO-TMPTA |

Those skilled in the art having the benefit of the teachings of the present invention as hereinabove set forth, can effect numerous modifications thereto. These modifications are to be construed as being encompassed within the scope of the present invention as set forth in the appended claims.

What is claimed is:

1. An actinic radiation curable homogeneous aqueous contact printing composition consisting essentially of:
   (a) a water-soluble compound containing at least one alpha,beta-ethylenically unsaturated radiation polymerizable double bond;
   (b) water,
   (c) optionally, a UV radiation photoinitiating system; and
   (d) optionally, a colorant which composition has a viscosity sufficiently high for contact printing and is capable of forming a cured film on a substrate from which greater than 50 ppb of uncured residue per square inch of said film is extractible after immersion and heating in 10 ml of a simulant liquid—when said surface is coated with said composition and exposed to an effective amount of actinic radiation in the presence of water.

2. The composition of claim 1 wherein the water-soluble compound is an oligomer.

3. The composition of claim 2 wherein the oligomer is an acrylate.

4. The composition of claim 3 wherein the acrylate is selected from the group consisting of a epoxy acrylate, a epoxy methacrylate, a polyether acrylate, a polyether methacrylate, a polyester acrylate, a polyester methacrylate, a polyurethane acrylate, a polyurethane methacrylate, a melamine acrylate, a melamine methacrylate, a polyethylene glycol diacrylate or a polyethylene glycol dimethacrylate.

5. The composition of claim 3 wherein the acrylate is an aromatic or aliphatic acrylate.

6. The composition of claim 3 wherein the acrylate is a diacrylate ester of an alkanolglycidyl ether or an ethoxylated aromatic epoxide or polyethylene glycol diacrylate.

7. The composition of claim 6 wherein the diacrylate ester of an alkanolglycidyl ether is 1,4-butanedioldiglycidyl ether and the diacrylate ester of an exthoylated aromatic epoxide is ethoxylated trimethylolpropanetriacrylate.

8. The composition of claim 6 wherein the ethoxylated aromatic epoxide contains 6 to 20 ethoxy groups.

9. The composition of claim 1 wherein the water is present in an amount ranging from about 5 weight % to about 25 weight %.

10. The composition of claim 1 wherein the actinic radiation is high energy electrons.

11. The composition of claim 1 wherein the composition further consists of a UV radiation photoinitiating system.

12. The composition of claim 1 whereby 50 ppb to 200,000 ppb of uncured residue is extractable from the said cured film, when immersed and heated in 10 ml of a simulant liquid per square inch of cured film.

13. The composition of claim 1 whereby 50 ppb to 25,000 ppb of uncured residue is extractable from the said cured film, when immersed and heated in 10 ml of a simulant liquid per square inch of cured film.

14. The composition of claim 1 whereby 50 ppb to 1,000 ppb of uncured residue is extractable from the said cured film, when immersed and heated in 10 ml of a simulant liquid per square inch of cured film.

15. An actinic radiation curable homogeneous aqueous contact printing ink composition for consisting essentially of:
   (a) a water-soluble compound containing at least one alpha,beta-ethylenically unsaturated radiation polymerizable double bond;
   (b) water;
   (c) a colorant; and
   (d) optionally, a UV radiation photoinitiating system;
which composition has a viscosity sufficiently high for contact printing and is capable of forming a cured film on a substrate from which greater than 50 ppb of uncured residue per square inch of said film is extractible after immersion and heating in 10 ml of a simulant liquid—when said surface is coated with said composition and exposed to an effective amount of actinic radiation in the presence of water.

16. The composition of claim 15 wherein the water soluble compound is an oligomer.

17. The composition of claim 16 wherein the oligomer is an acrylate.

18. The composition of claim 17 wherein the acrylate is selected from the group consisting of a epoxy acrylate, a epoxy methacrylate, a polyether acrylate, a polyether methacrylate, a polyester acrylate, a polyester methacrylate, a polyurethane acrylate, a polyurethane methacrylate, a melamine acrylate, a melamine methacrylate, a polyethylene glycol diacrylate or a polyethylene glycol dimethacrylate.

19. The composition of claim 17 wherein the acrylate is an aromatic or aliphatic acrylate.

20. The composition of claim 17 wherein the acrylate is a diacrylate ester of an alkanolglycidyl ether or an ethoxylated aromatic epoxide or polyethylene glycol diacrylate.

21. The composition of claim 14 wherein the diacrylate ester of an alkanolglycidyl ether is 1,4-butanedioldiglycidyl ether and the diacrylate ester of an exthoylated aromatic epoxide is ethoxylated trimethylolpropanetriacrylate.

22. The composition of claim 20 wherein the ethoxylated aromatic epoxide contains 6 to 20 ethoxy groups.

23. The composition of claim 15 wherein the water is present in an amount ranging from about 5 weight % to about 25 weight %.

24. The composition of claim 15 wherein the colorant is a dye, pigment or a mixture thereof.

25. The composition of claim 15 wherein the actinic radiation is high energy electrons.

26. The composition of claim 15 wherein the composition further consists of a UV radiation photoinitiating system.

27. The composition of claim 15 whereby 50 ppb to 200,000 ppb of uncured residue is extractable from said cured film, when immersed and heated in 10 ml of a simulant liquid per square inch of cured film.

28. The composition of claim 15 whereby 50 ppb to 25,000 ppb of uncured residue is extractable from said cured film, when immersed and heated in 10 ml of a simulant liquid per square inch of cured film.

29. The composition of claim 15 whereby 50 ppb to 1,000 ppb of uncured residue is extractable from said cured film, when immersed and heated in 10 ml of a simulant liquid per square inch of cured film.

* * * * *